(12) United States Patent
Kimura et al.

(10) Patent No.: US 7,488,678 B2
(45) Date of Patent: Feb. 10, 2009

(54) METHOD OF MANUFACTURING INTERCONNECT SUBSTRATE

(75) Inventors: Satoshi Kimura, Fujimi (JP); Hidemichi Furihata, Chino (JP); Toshihiko Kaneda, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/716,720

(22) Filed: Mar. 9, 2007

(65) Prior Publication Data

US 2007/0212871 A1 Sep. 13, 2007

(30) Foreign Application Priority Data

Mar. 10, 2006 (JP) .............................. 2006-065988

(51) Int. Cl.
*H01L 21/4763* (2006.01)

(52) U.S. Cl. ................. 438/618; 438/678; 257/E21.59; 257/E21.487; 257/E21.492

(58) Field of Classification Search ................. 438/618, 438/678, 687, 775
See application file for complete search history.

(56) References Cited

U.S. PATENT DOCUMENTS 6,485,831 B1 * 11/2002 Fukushima et al. ......... 428/403
6,680,081 B2 * 1/2004 Fukushima et al. ......... 427/214
2002/0142094 A1 * 10/2002 Fukushima et al. ......... 427/214

FOREIGN PATENT DOCUMENTS

| JP | 10-065315 | 3/1998 |
|----|-----------|--------|
| JP | 2005-223062 | 8/2005 |
| JP | 2005-223063 | 8/2005 |
| JP | 2005-223064 | 8/2005 |
| JP | 2005-223065 | 8/2005 |
| JP | 2005-286138 | 10/2005 |
| JP | 2005-286139 | 10/2005 |
| JP | 2006-265693 | 10/2006 |

* cited by examiner

*Primary Examiner*—David Nhu
(74) *Attorney, Agent, or Firm*—Harness, Dickey & Pierce, P.L.C.

(57) ABSTRACT

A method of manufacturing an interconnect substrate by electroless plating, including: (a) forming a catalyst layer with a specific pattern on a substrate; (b) immersing the substrate in a first electroless plating solution including a first metal to deposit the first metal on the catalyst layer to form a first metal layer; and (c) immersing the substrate in a second electroless plating solution including a second metal to deposit the second metal on the first metal layer to form a second metal layer, an ionization tendency of the first metal being higher than an ionization tendency of the second metal.

11 Claims, 5 Drawing Sheets

METHOD OF MANUFACTURING INTERCONNECT SUBSTRATE

Japanese Patent Application No. 2006-65988, filed on Mar. 10, 2006, is hereby incorporated by reference in its entirety.

BACKGROUND OF THE INVENTION

The present invention relates to a method of manufacturing an interconnect substrate.

Along with a recent increase in speed and density of electronic instruments, an additive method has attracted attention as a method of manufacturing an interconnect substrate. As the additive method, a method including patterning a photoresist provided on a substrate to form a plating resist and plating openings in the plating resist to deposit a metal layer, and a method including forming a catalyst layer with a desired pattern in advance and depositing a metal layer without using a plating resist have been known.

SUMMARY

According to one aspect of the invention, there is provided a method of manufacturing an interconnect substrate by electroless plating, the method comprising:
(a) forming a catalyst layer with a specific pattern on a substrate;
(b) immersing the substrate in a first electroless plating solution including a first metal to deposit the first metal on the catalyst layer to form a first metal layer; and
(c) immersing the substrate in a second electroless plating solution including a second metal to deposit the second metal on the first metal layer to form a second metal layer,
an ionization tendency of the first metal being higher than an ionization tendency of the second metal.

DETAILED DESCRIPTION OF THE EMBODIMENT

Figure 1:
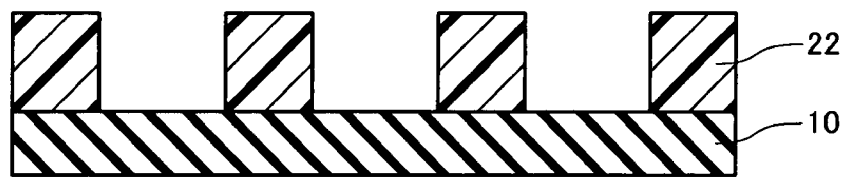
FIG. 1 is a diagram showing a method of manufacturing an interconnect substrate according to one embodiment of the invention.

The invention may provide a method of manufacturing an interconnect substrate capable of accurately forming high-density interconnects exhibiting excellent conductivity and high reliability.

According to one embodiment of the invention, there is provided a method of manufacturing an interconnect substrate by electroless plating, the method comprising:
(a) forming a catalyst layer with a specific pattern on a substrate;
(b) immersing the substrate in a first electroless plating solution including a first metal to deposit the first metal on the catalyst layer to form a first metal layer; and
(c) immersing the substrate in a second electroless plating solution including a second metal to deposit the second metal on the first metal layer to form a second metal layer,
an ionization tendency of the first metal being higher than an ionization tendency of the second metal.

According to this method, when immersing the substrate in the second electroless plating solution, displacement plating reaction occurs as first-stage plating reaction due to the difference in ionization tendency. Electroless plating reaction occurs when the first metal layer has been covered with the second metal, whereby the second metal can be further deposited.

In the step (c) of this method of manufacturing an interconnect substrate, the substrate may be immersed in the second electroless plating solution in a state in which a surface of the first metal layer is exposed.

In this method of manufacturing an interconnect substrate, the first metal may be nickel, and the second metal may be copper.

In this method of manufacturing an interconnect substrate, the second electroless plating solution may include formalin as a reducing agent.

In this method of manufacturing an interconnect substrate, the catalyst layer may include palladium.

This method of manufacturing an interconnect substrate may further comprise forming a surfactant layer on the substrate before the step (a).

In this method of manufacturing an interconnect substrate, the surfactant layer may include a cationic surfactant.

In this method of manufacturing an interconnect substrate, the step (c) may be performed within a specific period after performing the step (b).

This method of manufacturing an interconnect substrate may further comprise washing the substrate with water between the step (b) and the step (c).

This method of manufacturing an interconnect substrate may further comprise:
forming a resist layer on the substrate in a region other than a region of a desired interconnect pattern before the step (a); and forming a surfactant layer on the substrate before the step (a), wherein the step (a) may include:

forming a catalyst layer on the surfactant layer; and removing the resist layer to remove the surfactant layer and the catalyst layer in the region other than the region of the desired interconnect pattern.

Some embodiments of the invention will be described below with reference to the drawings.

1. Method of Manufacturing Interconnect Substrate

FIGS. 1 to 11 are diagrams showing a method of manufacturing an interconnect substrate 100 (see FIG. 11) according to one embodiment of the invention. In this embodiment, the interconnect substrate is manufactured by applying electroless plating.

(1) A substrate 10 is provided. The substrate 10 may be an insulating substrate, as shown in FIG. 1. The substrate 10 may be an organic substrate (e.g. plastic material or resin substrate) or an inorganic substrate (e.g. quartz glass, silicon wafer, or oxide layer). As examples of the plastic material, polyimide, polyethylene terephthalate, polycarbonate, polyphenylene sulfide, and the like can be given. The substrate 10 may be a light-transmitting substrate (e.g. transparent substrate). The substrate 10 includes a single-layer substrate and a multilayer substrate in which at least one insulating layer is formed on a base substrate. In this embodiment, a metal layer is formed on the substrate 10.

A resist layer 22 is formed. The resist layer 22 may be formed as shown in FIG. 1 by applying a resist (not shown) to the top surface of the substrate 10 and patterning the resist using a lithographic method. The resist layer 22 is formed in a region other than the region of a desired interconnect pattern.

(2) The substrate 10 is washed. The substrate 10 may be dry-washed or wet-washed. It is preferable to dry-wash the substrate 10. The resist layer 22 can be prevented from being damaged (e.g. separated) by dry-washing the substrate 10.

Figure 2:
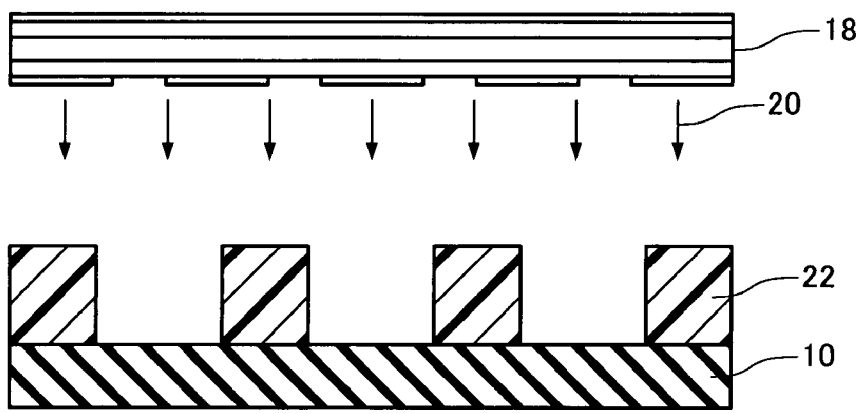
FIG. 2 is a diagram showing a method of manufacturing an interconnect substrate according to one embodiment of the invention.

As shown in FIG. 2, the substrate 10 may be dry-washed by applying vacuum ultraviolet radiation 20 for 30 to 900 seconds in a nitrogen atmosphere using a vacuum ultraviolet lamp 18. Soil such as oils adhering to the surface of the substrate 10 can be removed by washing the substrate 10. Moreover, the water-repellent surfaces of the substrate 10 and the resist layer 22 can be made hydrophilic. When the surface potential in liquid of the substrate 10 is negative, a surface at a uniform negative potential can be formed by washing the substrate 10.

The substrate 10 may be wet-washed by immersing the substrate 10 in ozone water (ozone concentration: 10 to 20 ppm) at room temperature for about 5 to 30 minutes, for example. The substrate 10 may be dry-washed by applying vacuum ultraviolet radiation for 30 to 900 seconds in a nitrogen atmosphere using a vacuum ultraviolet lamp (wavelength: 172 nm, output: 10 mW, sample-to-sample distance: 1 mm).

Figure 3:
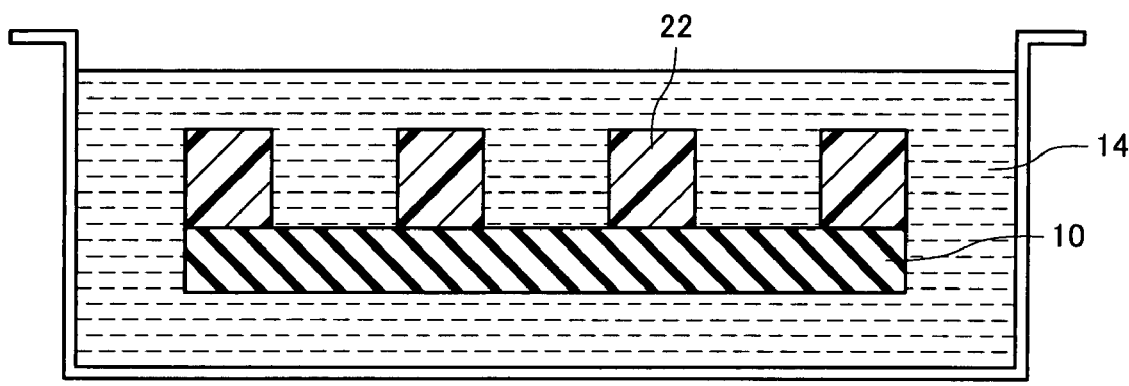
FIG. 3 is a diagram showing a method of manufacturing an interconnect substrate according to one embodiment of the invention.
Figure 4:
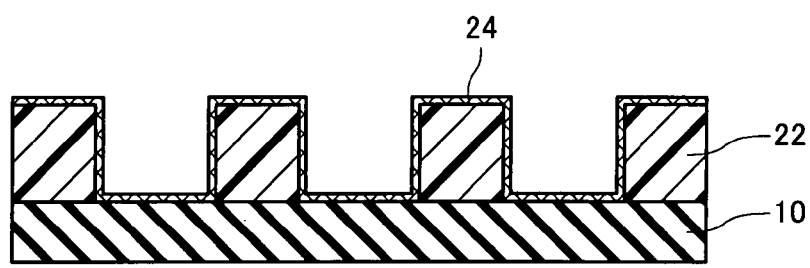
FIG. 4 is a diagram showing a method of manufacturing an interconnect substrate according to one embodiment of the invention.

(3) As shown in FIG. 3, the substrate 10 is immersed in a surfactant solution 14. The surfactant contained in the surfactant solution 14 may be a cationic surfactant or an anionic surfactant. When the surface potential in liquid of the substrate 10 is negative, it is preferable to use the cationic surfactant. This is because the cationic surfactant is easily adsorbed on the substrate 10 in comparison with other surfactants. When the surface potential in liquid of the substrate 10 is positive, it is preferable to use the anionic surfactant as the surfactant contained in the surfactant solution 14.

As the cationic surfactant, a water-soluble surfactant containing an aminosilane component, an alkylammonium surfactant (e.g. cetyltrimethylammonium chloride, cetyltrimethylammonium bromide, or cetyldimethylammonium bromide), or the like may be used. As the anionic surfactant, a polyoxyethylene alkyl ether sulfate (sodium dodecyl sulfate, lithium dodecyl sulfate, or N-lauroylsarcosine) or the like may be used. The immersion time may be about 1 to 10 minutes, for example.

The substrate 10 is removed from the surfactant solution and washed with ultrapure water. After air-drying the substrate 10 at room temperature or removing waterdrops by spraying compressed air, the substrate 10 is dried in an oven at 90 to 120° C. for about 10 minutes to 1 hour. A surfactant layer 24 (see FIG. 4) can be formed on the substrate 10 by the above steps. When using the cationic surfactant as the surfactant, the surface potential in liquid of the substrate 10 is shifted to the positive potential side in comparison with the surface potential before adsorption.

Figure 5:
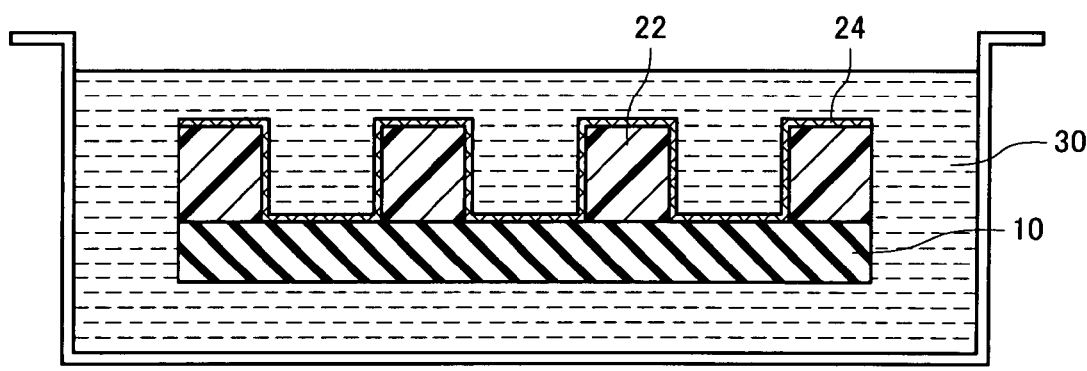
FIG. 5 is a diagram showing a method of manufacturing an interconnect substrate according to one embodiment of the invention.

(4) As shown in FIG. 5, the substrate 10 is immersed in a catalyst solution 30. The catalyst solution 30 includes a catalyst component which functions as a catalyst for electroless plating. For example, palladium may be used as the catalyst component.

The catalyst solution 30 may be prepared as follows, for example.

(4a) Palladium pellets with a purity of 99.99% are dissolved in a mixed solution of hydrochloric acid, hydrogen peroxide solution, and water to prepare a palladium chloride solution with a palladium concentration of 0.1 to 0.5 g/l.

(4b) The palladium concentration of the palladium chloride solution is adjusted to 0.01 to 0.05 g/l by diluting the palladium chloride solution with water and a hydrogen peroxide solution.

(4c) The pH of the palladium chloride solution is adjusted to 4.5 to 6.8 using a sodium hydroxide aqueous solution or the like.

The substrate 10 may be washed with water after immersing the substrate 10 in the catalyst solution 30. The substrate 10 may be washed with pure water. A catalyst residue can be prevented from being mixed into an electroless plating solution described later by washing the substrate 10 with water.

Figure 6:
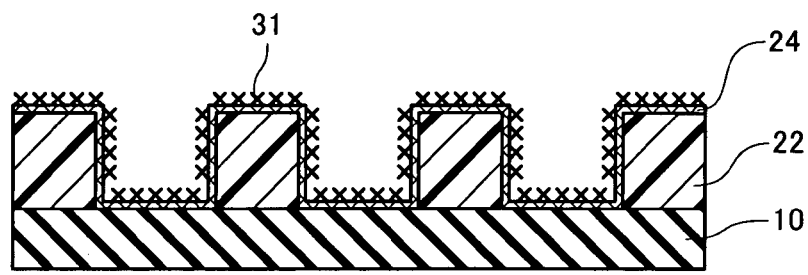
FIG. 6 is a diagram showing a method of manufacturing an interconnect substrate according to one embodiment of the invention.

A catalyst layer 31 is formed by the above steps. As shown in FIG. 6, the catalyst layer 31 is formed on the top surface of the surfactant layer 24 formed on the substrate 10 and the resist layer 22.

Figure 7:
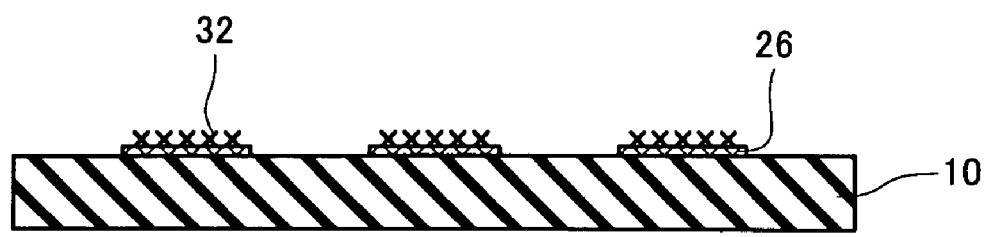
FIG. 7 is a diagram showing a method of manufacturing an interconnect substrate according to one embodiment of the invention.

As shown in FIG. 7, the resist layer 22 is removed to form the surfactant layer 26 and the catalyst layer 32 having a desired interconnect pattern. The resist layer 22 may be removed using acetone or the like. The surfactant layer 24 and the catalyst layer 31 formed on the resist layer 22 are also removed together with the resist layer 22.

(5) A first metal layer 34 is deposited on the catalyst layer 32. In more detail, the metal layer 34 may be deposited on the catalyst layer 32 by immersing the substrate 10 in a first electroless plating solution containing a first metal (see FIG. 8).

The first metal has an ionization tendency higher than that of a second metal described later. The first metal may be nickel, for example. The electroless plating solution is classified as an electroless plating solution used in an acidic region or an electroless plating solution used in an alkaline region. As an example of the first electroless plating solution, an electroless plating solution used in an acidic region is applied. The first electroless plating solution includes the above-mentioned first metal, a reducing agent, a complexing agent, and the like. Specifically, an electroless plating solution may be used which mainly includes nickel sulfate hexahydrate or nickel chloride hexahydrate and includes sodium hypophosphite as the reducing agent. For example, a nickel layer with a thickness of 20 to 100 nm may be formed by immersing the substrate 10 in an electroless plating solution (temperature: 70 to 80° C.) containing nickel sulfate hexahydrate for about 10 seconds to 10 minutes.

Figure 8:
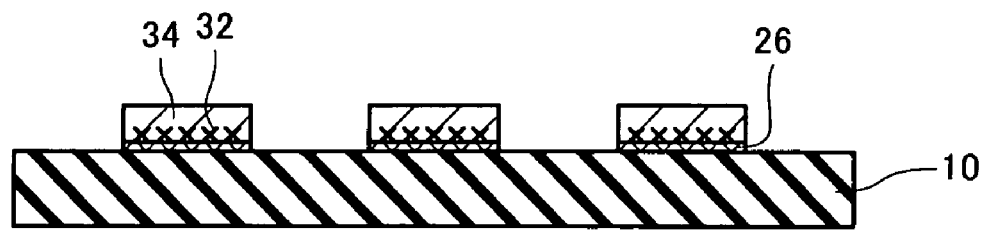
FIG. 8 is a diagram showing a method of manufacturing an interconnect substrate according to one embodiment of the invention.

The first metal layer 34 can be thus formed on the top surface of the catalyst layer 32 on the substrate 10, as shown in FIG. 8.

The substrate 10 may be washed with water after immersing the substrate 10 in the first electroless plating solution. The substrate 10 may be washed using pure water, steam, or pure water and steam. This washing prevents a residue of the first electroless plating solution from being mixed into a second electroless plating solution described later. The substrate 10 may be dried by heating after washing with water. This improves the adhesion of the first metal layer 34 to the substrate 10.

(6) A second metal layer 37 is deposited on the first metal layer 34. In more detail, the second metal layer 37 may be deposited on the first metal layer 34 by immersing the substrate 10 in a second electroless plating solution 38 containing a second metal in a state in which the first metal layer 34 is exposed (see FIG. 11).

The second metal has an ionization tendency lower than that of the above-described first metal. The second metal may be copper, for example. As an example of the second electroless plating solution, an electroless plating solution used in an alkaline region is applied. The second electroless plating solution 38 includes the above-mentioned second metal, a reducing agent, a complexing agent, and the like. As the reducing agent, formalin or the like may be applied. Nickel as the first metal is not reduced by formalin used as the reducing agent, nickel dissolved in the electroless plating solution 38 can be prevented from being deposited by electroless plating reaction. The second electroless plating solution 38 may be used while being heated at 65 to 85° C., for example. It is preferable to immerse the substrate 10 in the second electroless plating solution 38 containing the second metal within a specific period after forming the first metal layer. The specific period may vary depending on the conditions such as the presence or absence of the drying step. According to the experiments conducted by the inventors, it was confirmed that the following plating reaction occurs when the specific period is within 48 hours.

Figure 9:
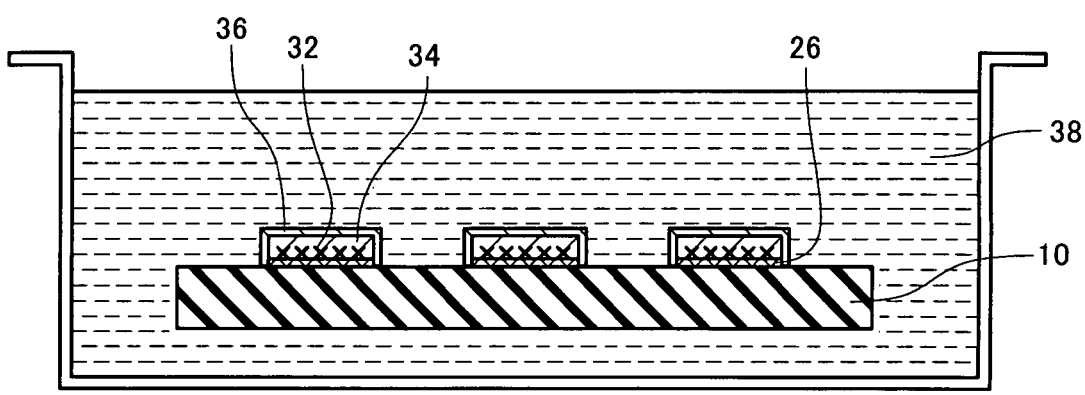
FIG. 9 is a diagram showing a method of manufacturing an interconnect substrate according to one embodiment of the invention.

A two-step reaction occurs when using the above-mentioned second electroless plating solution 38. As the first-stage reaction, the following displacement plating reaction occurs on the surface of the first metal layer 34, as shown in FIG. 9.

$M_1 + M_2^+ \rightarrow M_1^+ + M_2$ (wherein $M_1$ is the first metal, and $M_2$ is the second metal.)

This displacement plating reaction may continue until the first metal layer 34 is entirely covered with the second metal layer 36.

Figure 10:
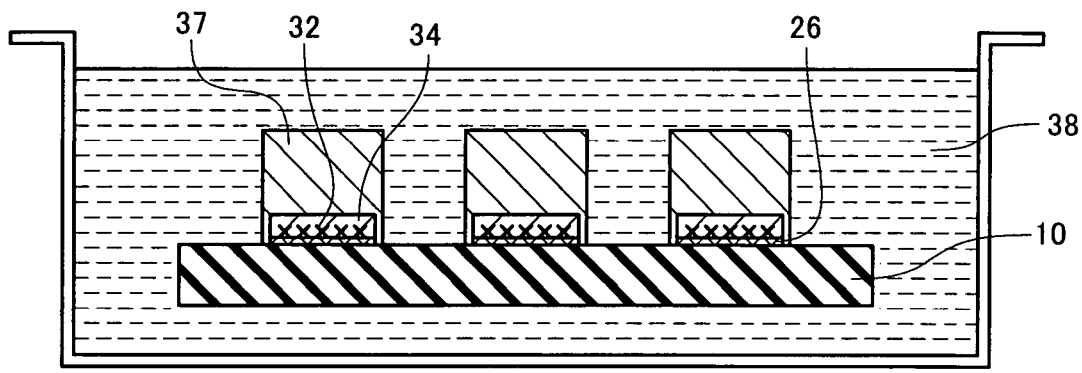
FIG. 10 is a diagram showing a method of manufacturing an interconnect substrate according to one embodiment of the invention.
Figure 11:
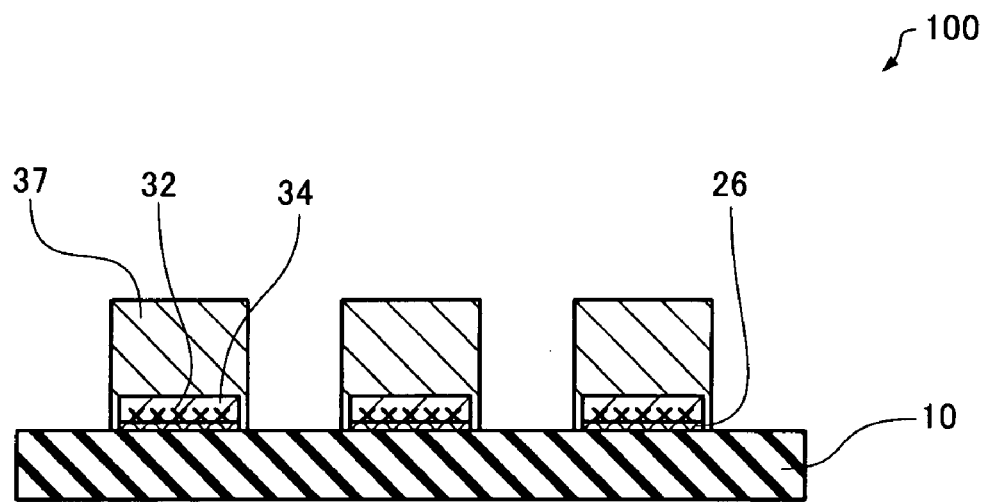
FIG. 11 is a diagram showing a method of manufacturing an interconnect substrate according to one embodiment of the invention.

As shown in FIG. 10, electroless plating reaction occurs on the surface of the second metal layer 36 as the second-stage reaction, whereby the second metal is deposited on the second metal layer 36 to form the second metal layer 37 with a larger thickness. For example, the total thickness of the first metal layer 34 and the second metal layer 37 may be 200 nm.

The interconnect substrate 100 can be formed by the above steps. In the method of manufacturing the interconnect substrate 100 according to this embodiment, since the second metal is deposited by displacement plating reaction when forming the second metal layer 36, it is unnecessary to form a catalyst layer for depositing the second metal. Therefore, a step of providing a catalyst layer can be omitted, whereby the number of steps can be reduced. The first metal (e.g. nickel) can be replaced by the displacement plating reaction with the second metal (e.g. copper) having an excellent conductivity.

A copper electroless plating solution is generally alkaline. On the other hand, the surfactant layer may be dissolved in the alkaline solution, whereby the catalyst layer may be removed from the substrate. According to this embodiment, the first metal layer can be deposited using a solution in which the surfactant layer is not dissolved (e.g. neutral or acidic first electroless plating solution) to cover the surfactant layer, and the second metal layer can be deposited using an alkaline second electroless plating solution, for example. The catalyst layer and the metal layer can be prevented from being removed from the substrate, even if the second electroless plating solution is a solution which dissolves the surfactant layer, by forming the first metal layer in advance, whereby a highly reliable interconnect substrate can be formed.

In the method of manufacturing the interconnect substrate 100 according to this embodiment, the first metal has an ionization tendency higher than that of the second metal. This allows the second metal to be deposited on the first metal layer. In general, since a metal with a higher ionization tendency is more easily oxidized, an interconnect formed can be prevented from being oxidized by covering the first metal layer with the second metal layer.

According to the method of manufacturing the interconnect substrate 100 according to this embodiment, it was confirmed that high-density interconnects can be accurately formed by the additive method. For example, it was confirmed that interconnects with a width of 900 nm can be formed on the substrate at intervals of 1 micrometer.

2. Electronic Device

Figure 12:
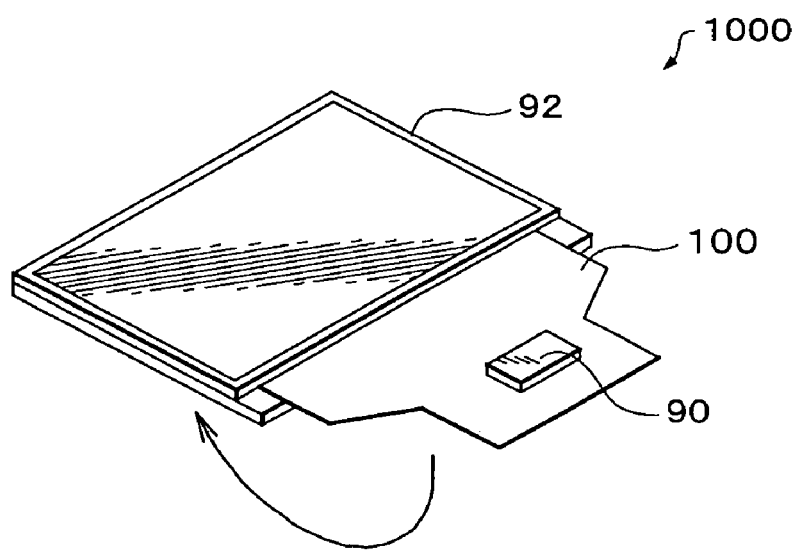
FIG. 12 shows an example of an electronic device to which an interconnect substrate according to one embodiment of the invention is applied.

FIG. 12 shows an example of an electronic device to which an interconnect substrate manufactured by the method of manufacturing an interconnect substrate according to one embodiment of the invention is applied. An electronic device 1000 includes the interconnect substrate 100, an integrated circuit chip 90, and another substrate 92.

The interconnect pattern formed on the interconnect substrate 100 may be used to electrically connect electronic parts. The interconnect substrate 100 is manufactured by the above-described manufacturing method. In the example shown in FIG. 12, the integrated circuit chip 90 is electrically connected with the interconnect substrate 100, and one end of the interconnect substrate 100 is electrically connected with the other substrate 92 (e.g. display panel). The electronic device 1000 may be a display device such as a liquid crystal display device, a plasma display device, or an electroluminescent (EL) display device.

3. Experimental Example

An interconnect substrate was formed using the method of manufacturing an interconnect substrate according to this embodiment.

(1) A photoresist film was formed on a glass substrate. The photoresist film was exposed and developed by using a direct writing method in the shape of straight lines with a width of about 800 nm at a pitch of about 1 micrometer to form a photoresist having straight lines with a width of about 200 nm and stripe-shaped openings with a width of about 800 nm.

(2) The glass substrate was cut in the shape of a 1×1 cm square. The glass substrate was immersed in a cationic surfactant solution (FPD conditioner manufactured by Technic Japan Incorporated). The glass substrate was then immersed in a palladium catalyst solution. The photoresist on the glass substrate was removed using an organic solvent such as acetone. A stripe-shaped catalyst layer having straight lines with a width of 800 nm at intervals of about 200 nm was formed in this manner.

(3) The glass substrate on which the catalyst layer was formed was immersed in a nickel electroless plating solution (FPD nickel manufactured by Technic Japan Incorporated) (80° C.) for 30 seconds to form a nickel metal layer with a thickness of about 20 nm and a width of about 800 nm.

The glass substrate was sufficiently washed with water and fired at 100 to 150° C. for 10 minutes to evaporate water in the nickel metal layer. Adhesion to the substrate was improved by this treatment.

(4) The glass substrate was immersed in a copper electroless plating solution (KC500 manufactured by Nippon Mining & Metals Co., Ltd.) at a temperature of 80° C. and a pH of 12.0 to 13.0 for 3 to 5 minutes within 30 minutes after forming the nickel metal layer (first metal layer) to form a copper metal layer (second metal layer) with a thickness of about 150 nm and a width of about 900 nm.

It was confirmed that copper was deposited on the interconnect substrate formed by the above-described steps. Specifically, copper could be deposited without causing a catalyst such as palladium to adhere to the nickel metal layer. A copper-colored line was confirmed on the back surface of the glass substrate. This indicates that displacement plating reaction occurred in which nickel was replaced with copper.

The invention is not limited to the above-described embodiments. Various modifications and variations may be made. In the above-described embodiment, the resist layer is provided in advance on the substrate in the region other than the desired pattern region, the surfactant layer and the catalyst layer are formed on the entire surface, and the catalyst layer is formed in a specific region by removing the resist layer. Note that the catalyst layer may be formed without using the resist layer. Specifically, the surfactant layer is formed on the entire surface of the substrate, and the surfactant layer is partially optically decomposed to allow the surfactant layer to remain only in the desired pattern region. This allows the catalyst layer to be formed only in the desired pattern region. The surfactant layer may be optically decomposed using vacuum ultraviolet (VUV) radiation. An interatomic bond (e.g. C—C, C=C, C—H, C—F, C—Cl, C—O, C—N, C=O, O=O, O—H, H—F, H—Cl, and N—H) can be cut by setting the wavelength of light at 170 to 260 nm, for example. It becomes unnecessary to provide a yellow room or the like by using the above wavelength band, whereby a series of steps according to this embodiment can be performed under white light, for example.

The invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A method of manufacturing an interconnect substrate by electroless plating, the method comprising:
    (a) forming a catalyst layer with a specific pattern on a substrate;
    (b) immersing the substrate in a first electroless plating solution including a first metal to deposit the first metal on the catalyst layer to form a first metal layer; and
    (c) immersing the substrate in a second electroless plating solution including a second metal to deposit the second metal on the first metal layer to form a second metal layer,
    an ionization tendency of the first metal being higher than an ionization tendency of the second metal.

2. The method of manufacturing an interconnect substrate as defined in claim 1,
    wherein, in the step (c), the second metal is deposited by displacement plating in which the first metal is replaced with the second metal, and the second metal is then deposited by electroless plating.

3. The method of manufacturing an interconnect substrate as defined in claim 1,
    wherein, in the step (c), the substrate is immersed in the second electroless plating solution in a state in which a surface of the first metal layer is exposed.

4. The method of manufacturing an interconnect substrate as defined in claim 1,
    wherein the first metal is nickel, and the second metal is copper.

5. The method of manufacturing an interconnect substrate as defined in claim 4,
    wherein the second electroless plating solution includes formalin as a reducing agent.

6. The method of manufacturing an interconnect substrate as defined in claim 4,
    wherein the catalyst layer includes palladium.

7. The method of manufacturing an interconnect substrate as defined in claim 6, further comprising:
    forming a surfactant layer on the substrate before the step (a).

8. The method of manufacturing an interconnect substrate as defined in claim 7,
    wherein the surfactant layer includes a cationic surfactant.

9. The method of manufacturing an interconnect substrate as defined in claim 4,
    wherein the step (c) is performed within a specific period after performing the step (b).

10. The method of manufacturing an interconnect substrate as defined in claim 1, further comprising:
    washing the substrate with water between the step (b) and the step (c).

11. The method of manufacturing an interconnect substrate as defined in claim 1, further comprising:
    forming a resist layer on the substrate in a region other than a region of a desired interconnect pattern before the step (a); and
    forming a surfactant layer on the substrate before the step (a),
    wherein the step (a) includes:
    forming a catalyst layer on the surfactant layer; and
    removing the resist layer to remove the surfactant layer and the catalyst layer in a region other than a region of a desired interconnect pattern.

* * * * *